(12) United States Patent  
Trika et al.

(10) Patent No.: US 10,761,779 B2  
(45) Date of Patent: Sep. 1, 2020

(54) STORAGE COMPUTE OFFLOADS ON SHARDED AND ERASURE-CODED DATA

(71) Applicant: Intel Corporation, Santa Clara, CA (US)

(72) Inventors: Sanjeev N. Trika, Portland, OR (US); Steven C. Miller, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/211,108

(22) Filed: Dec. 5, 2018

(65) Prior Publication Data

US 2019/0114114 A1   Apr. 18, 2019

(51) Int. Cl.
| | |
|---|---|
| *G06F 12/02* | (2006.01) |
| *G06F 3/06* | (2006.01) |
| *G06F 11/10* | (2006.01) |
| *H03M 13/15* | (2006.01) |

(52) U.S. Cl.  
CPC ............ *G06F 3/0659* (2013.01); *G06F 3/067* (2013.01); *G06F 3/0619* (2013.01); *G06F 3/0647* (2013.01); *G06F 11/1076* (2013.01); *H03M 13/154* (2013.01)

(58) Field of Classification Search  
CPC .. G06F 12/1036; G06F 16/182; G06F 3/0688; G06F 11/3006  
See application file for complete search history.

(56) References Cited

U.S. PATENT DOCUMENTS

| | | | | |
|---|---|---|---|---|
| 2010/0191923 | A1* | 7/2010 | Archer ................ | G06F 12/1036 711/154 |
| 2013/0339805 | A1* | 12/2013 | Aho .................... | G06F 11/3006 714/48 |
| 2015/0106325 | A1* | 4/2015 | Cole .................... | G06F 16/283 707/600 |
| 2016/0283141 | A1* | 9/2016 | Hayes .................. | G06F 3/0688 |
| 2018/0081798 | A1* | 3/2018 | Alcantara ............ | G06F 16/182 |

OTHER PUBLICATIONS

Choi et al, "Energy Efficient Scale-In Clusters with In-Storage Processing for Big-Data Analytics", MEMSYS, Oct. '15.

(Continued)

*Primary Examiner* — Ryan Bertram  
*Assistant Examiner* — Trang K Ta  
(74) *Attorney, Agent, or Firm* — Compass IP Law, PC

(57) ABSTRACT

Techniques enable offloading operations to be performed closer to where the data is stored in systems with sharded and erasure-coded data, such as in data centers. In one example, a system includes a compute sled or compute node, which includes one or more processors. The system also includes a storage sled or storage node. The storage node includes one or more storage devices. The storage node stores at least one portion of data that is sharded and erasure-coded. Other portions of the data are stored on other storage nodes. The compute node sends a request to offload an operation to the storage node to access the sharded and erasure-coded data. The storage node then sends a request to offload the operation to one or more other storage nodes determined to store one or more codes of the data. The storage nodes perform the operation on the portions of locally stored data and provide the results to the next-level up node.

20 Claims, 10 Drawing Sheets

(56) References Cited

OTHER PUBLICATIONS

Gaysse, "A Comparison of In-Storage Processing Architectures and Technologies", SDC Sep. 18.
Gu et al, "Biscuit: A Framework for Near-Data Processing of Big Data Workloads", 2016 ACM/IEEE Symposium on Computer Arch.
Jun et al, "BlueDBM: Distributed Flash Storage for Big Data Analytics", ACM Transactions on Computer Systems, vol. 34, No. 3, Jun. 2016.
Kang et al, "Enabling Cost-effective Data Processing with Smart SSD", Mass Storage Systems and Technologies (MSST), 2013.
Koo et al, "Summarizer: Trading Communication with Computing Near Storage", IEEE/ACM International Symposium on Microarchitecture, Cambridge, MA, USA, Oct. 2017.
Park et al, "In-Storage Computing for Hadoop . . . ", IEEE Transactions on Computers (TC), Jun. 2016.
Shadley, "Deployment of In-Storage Compute", SDC Sep. 18.
Wang et al, "SSD In-Storage Computing for Search Engines." IEEE Transactions on Computers (TC), Sep. 2016.
Wang et al. "SSD In-Storage Computing for List Intersection". In Proceedings of the 12th International Workshop on Data Management on New Hardware(DaMoN '16), in conjunction with SIGMOD, Jun. 2016.
Yang Seok Ki, "In-Storage Compute: an Ultimate Solution for Accelerating I/O-intensive Applications", FMS, Aug. '15.

\* cited by examiner

Shard Map 300A

| Shard # | Rack # | Sled # |
|---------|--------|--------|
| 1 | 3 | 5 |
| 2 | 4 | 6 |
| ... | ... | ... |

FIG. 3A

EC Map 300B

| Code # | Sled # | Disk # | LBA # |
|--------|--------|--------|-------|
| 1 | 3 | 5 | 7 |
| 2 | 4 | 6 | 8 |
| ... | ... | ... | ... |

FIG. 3B

Method at a compute node 500A determine that an operation is to be performed on data that is stored across multiple nodes 531 determine locations of shards to be accessed by the operation 532 send a request to offload the operation to multiple storage nodes determined to be storing the shards 534 combine results from the multiple storage nodes 536

FIG. 5A

(Status, Answer) ← ComputeSled::ExecuteOffload (offload-binary B, data-range D)

600   $S_1 ... S_a$ ← ShardingEngine.IdentifyShards (D) // find shards that together contain D
602   For i = 1 to a do:
604      OwnerStorageSled ← ShardingEngine.OwnerStorageSledForSled ($S_i$)
606      $D_j$ ← ShardingEngine.ShardedAddresses (D, i) // addresses within $S_j$ for range D
608      ($status_i$, $answer_i$) ← OwnerStorageSled.ExecuteOffload (B, $D_j$)
610      If ($status_j$ is an insufficient-data-failure-code)
612        Data ← Read all data for D   //worst case: we run the entire op on compute node
614        return (B.Execute (D))
616      end if
618      If ($status_j$ == failure code)
620        return ($status_i$, null) // in practice, a secondary owner sled may be used
622      End if
624   end for
626   Answer = B.appendAnswer ($answer_1$, $answer_2$, ..., $answer_a$)
628   return (SuccessStatusCode, Answer)

FIG. 6A (Status, Answer) ← StorageSled::ExecuteOffload (offload-binary B, data-range Di)

640    X₁ ... Xₙ ← EcEngine.TargetDataDisks (Di)
642    For j = 1 to n do:
644        Sj ← EcEngine.StorageSledForDisk(Xj)
646        Dij ← EcEngine.DataAddressesPostEcFor (Di)
648        (statusij, answerij) ← Sj.ExecutePostEcOffload (B, Xj, Dij)
650        If (statusij is an insufficient-data-failure-code)
652            Dataj ← Read all data for Dj   (i.e., we won't further offload this section)
654            return (B.Execute (Di))
656        else if (statusij is a read-failure-code)
658            // correct the error at this level and execute at this level
660            Dataij ← ReadWithErrorCorrection (Dij)
662            (statusij, answerij) ← B.Execute (Dataij)
664            If (statusij is a failure-code)
666                return (statusij, null)
668            end if
670        end if
672    end for
674    Answeri = B.appendAnswer (answeri1, answeri2, ..., answerin)
676    return (SuccessStatusCode, Answeri)

FIG. 6B (Status, Answer) ← StorageSled::ExecutePostEcOffload (offload-binary B, Disk $X_j$, data-range $D_{ij}$)

670  (status, Data$_{ij}$) ← $X_j$.Read($D_{ij}$)
672  If (status == fail)
674      return (status, null)
676  end if
678  return (B.Execute(Data$_{ij}$))

FIG. 6C

STORAGE COMPUTE OFFLOADS ON SHARDED AND ERASURE-CODED DATA

FIELD

The descriptions are generally related to computers and more specifically to computation in systems with distributed data storage.

BACKGROUND

With the emergence of cloud computing and other internet based high end computing implementations, new ways of implementing high performance computing systems are being investigated and pursued. The performance and/or efficiency of the computing racks used by high performance data centers are especially receiving more focused attention.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" or "examples" are to be understood as describing a particular feature, structure, and/or characteristic included in at least one implementation of the invention. Thus, phrases such as "in one embodiment" or "in one example" appearing herein describe various embodiments and implementations of the invention, and do not necessarily all refer to the same embodiment. However, they are also not necessarily mutually exclusive.

FIG. 3A illustrates an exemplary shard map.

FIG. 3B illustrates an exemplary EC map.

FIGS. 5A and 5B are flow charts of methods of offloading operations on data that is sharded and erasure-coded across multiple nodes and racks.

FIGS. 6A-6C illustrate an example of pseudocode for techniques for offloading operations to be performed on sharded, erasure-coded data.

Descriptions of certain details and implementations follow, including a description of the figures, which may depict some or all of the embodiments described below, as well as discussing other potential embodiments or implementations of the inventive concepts presented herein.

DETAILED DESCRIPTION

The present disclosure describes techniques for running storage offloads on data that is sharded and erasure-coded across multiple storage nodes and racks.

Typical data centers are designed to achieve a high level of availability and load balancing. To achieve both availability and load balancing, data may be sharded across multiple nodes. Each of those nodes then erasure-codes the data into codes which are stored across multiple nodes. The sharding and erasure coding enables balancing of cost and reliability requirements for a datacenter while maintaining node-level and sometimes even rack-level fault domains.

In addition to cost, reliability, and availability, it is also desirable to reduce power consumption and increase the speed and efficiency of data transfer and computation. One technique that can be used to improve efficiency and power consumption is to move compute operations closer to the storage devices where the data is stored. However, the multi-way splicing of data that has been sharded and erasure-coded makes it impossible for conventional techniques to offload operations to where the data is stored.

In contrast, techniques described in the present disclosure enable offloading operations in cases where the data is sharded and erasure-coded across multiple nodes. In one example, a system (e.g., one or more racks in a data center) includes a compute node and a storage node. For a given operation, the compute node determines the locations of shards to be accessed by the operation and sends a request to offload the operation to storage nodes determined to be an owner of the shard. The storage nodes receive the requests from the compute node to offload the operation for a given shard, and determine the location of codes (e.g., EC codes) for the given shard. The storage nodes then send requests to offload the operation to storage nodes determined to store the codes. The storage node performs the operation on that data (e.g., on a code stored on the storage node) and provides the result back to the next level up node. Thus, the operation can be performed at the storage nodes where the data is stored, which significantly reduces the amount of data transferred between nodes.

Techniques for offloading operations on data that is sharded and erasure-coded across multiple nodes can be implemented in a variety of architectures. For example, such techniques can be implemented in hyperconverged architectures, disaggregated architectures, or other architectures in which data may be stored across multiple nodes.

Figure 1:
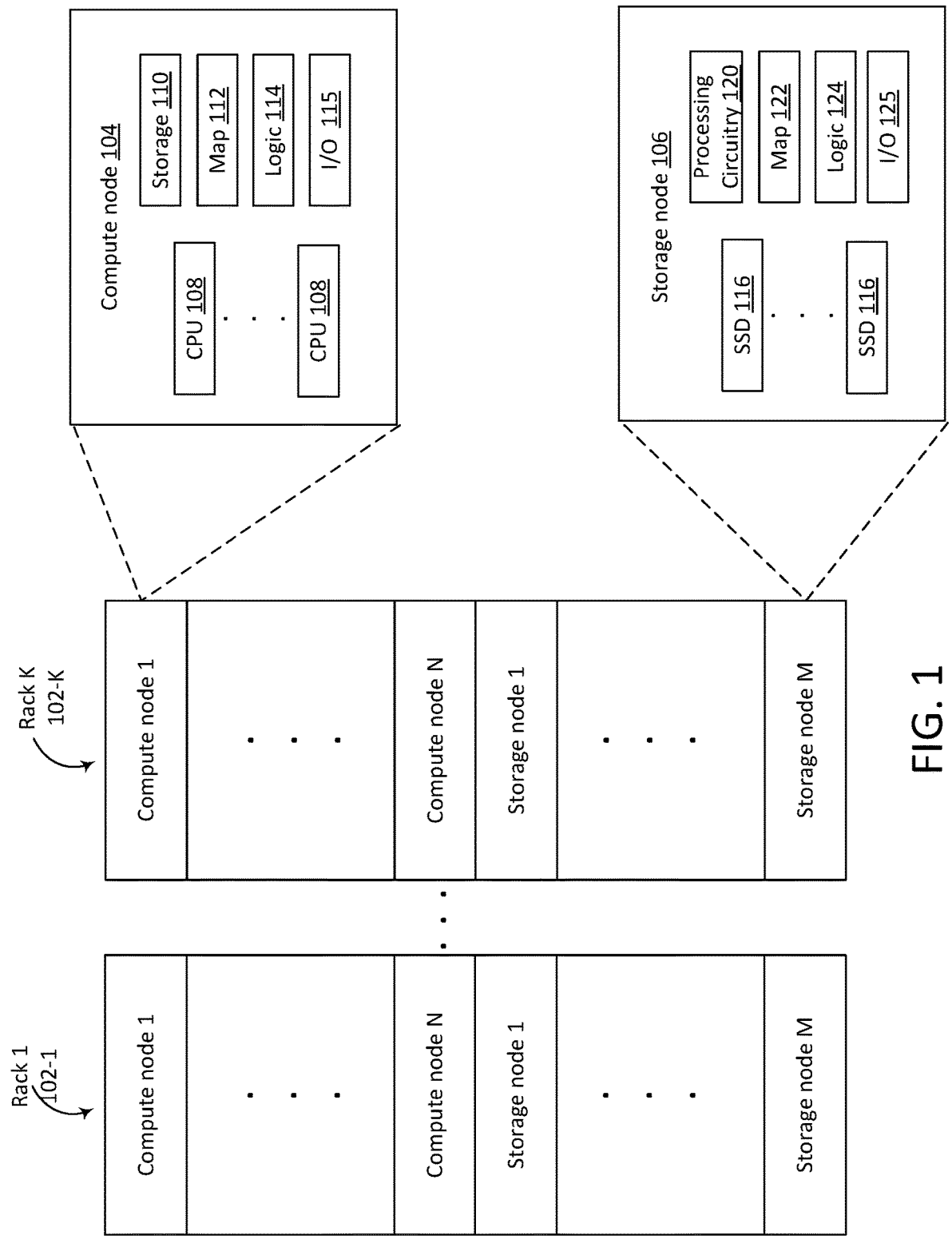
FIG. 1 illustrates an example of a disaggregated rack architecture in which storage offload techniques may be implemented.

FIG. 1 illustrates an example of a disaggregated rack architecture in which storage offload techniques may be implemented. FIG. 1 illustrates an example of a system with K racks 102-1-102-K of computing resources, which may be used in a data center to store and process data. The racks 102-1-102-K can be in a same physical area, or in physically or geographically separate areas. In the illustrated example, each rack includes N compute nodes and M storage nodes. A node is a physical or virtual machine including or having access to one or more computing resources. Independent of whether a node is a physical or virtual machine, a node is a unique fault domain with respect to other nodes. A fault domain is an independent domain with no single point of failure (e.g., there is redundant cooling, power, and/or network paths). A storage node is a physical computer (e.g., server) including non-volatile storage. In the example illustrated in FIG. 1, the storage nodes 106 include solid state drives (SSDs) 116 to store data. The storage nodes 106 also include processing circuitry 120, which may include one or more of: a central processing unit (CPU), analog processing circuitry, a field programmable gate array (FPGA), an application specific integrated circuit (ASIC), accelerators, or other processing and/or control circuitry. A compute node is a physical computer including processors. For example, the compute nodes 104 include CPUs 108. The compute node 104 also includes storage 110, which can be a solid-state drive or other non-volatile storage. A compute node can be referred to as a compute sled, blade, shelf, chassis, server, appliance, machine, or computer. Similarly, a storage node can also be referred to as a storage sled, blade, shelf, chassis, server, appliance, machine, or computer.

The compute node illustrated in FIG. 1 includes CPUs 108, storage 110, input/output (I/O) interface logic 115 and logic 114. The compute node 104 illustrated in FIG. 1 also stores a map 112 to determine the location of shards of data. The I/O interface logic 115 can include hardware and/or software to enable communication both within the compute node and with other nodes. The logic 114 can include hardware, software, or both to implement the compression and offloading techniques described in this disclosure. The storage node 106 includes SSDs 116, processing circuitry 120, I/O interface logic 125, and logic 124. The storage node 106 of FIG. 1 also stores a map 122 to determine the locations of codes. The logic 124 can include hardware, software, or both to implement the decompression and offloading techniques described in this disclosure. The nodes 104 and 106 can include different or additional resources than what is depicted in FIG. 1.

The nodes are communicatively coupled by one or more networks. For example, the nodes within the rack can be coupled via an Ethernet or proprietary local area network (LAN). The racks 102-1-102-K can include a switching hub (not shown in FIG. 1) to implement such a network. Multiple racks can be communicatively coupled to one another via gateways between each rack's network and another, external network that couples the racks to one another.

The nodes in FIG. 1 are disaggregated in the sense that data center hardware resources (e.g., compute, memory, storage, and network resources) can be packaged and installed individually in a rack. For example, storage resources are installed in the racks 102 as storage nodes or sleds, and compute resources are installed in the racks 102 as compute nodes or sleds. Thus, the compute nodes and storage nodes in FIG. 1 differ from conventional servers in that different nodes can include a different balance of computing resources and do not necessarily include all the components of a conventional server. In a conventional rack infrastructure, the computing resources have the granularity of an entire server computer. Thus, in a traditional infrastructure, a deficiency in resources can only be addressed by adding an entire server computer. As an example, to address a deficiency in CPU processing power, one or more additional servers would be added to the rack, which would increase the CPU processing power. However, the additional servers would also increase the storage resources and other power consuming elements, which may be unnecessary and even undesirable. Unlike conventional rack architecture, a disaggregated architecture enables addressing deficiencies in resources by adding more of the specific resources that are lacking without adding additional and unnecessary resources.

As mentioned above, data stored in a datacenter is typically stored across multiple devices, nodes, and or racks to ensure availability and improve load balancing. One way in which data availability is increased is through erasure coding, and one way that load balancing can be increased is through data sharding. In one example, the compute nodes 104 and storage nodes 106 include logic 114 and 124 and maps 112 and 122 to perform sharding and erasure coding.

Take one specific example in which a compute node is a compute sled and each storage node is a storage sled including 14 disks. In this example, assume the configuration supports multiple 10 GB data-volumes (e.g., where one data volume is assigned to a virtual machine or container). Each 10 GB data-volume is sharded with a shard-size=10 MB, and then 10+4 erasure-coded with a code-size of 100 kB. When a compute sled is going to write data (e.g., aligned 1 MB), the compute sled runs algorithms (e.g., "crush") to determine which one of the 1000 target shards that comprises the data volume to write this data to. This dictates the "owner" storage sled, which may be on a different rack to which the write is to be done. The write is then issued to the appropriate storage sled. The shard-owner storage sled in turn divides up the 1 MB write into 14 100 kB codes using an erasure-coding algorithm. It then writes one of the codes to a local SSD and the other 13 codes to the algorithmically determined drives on the algorithmically determined other sleds.

Figure 2:
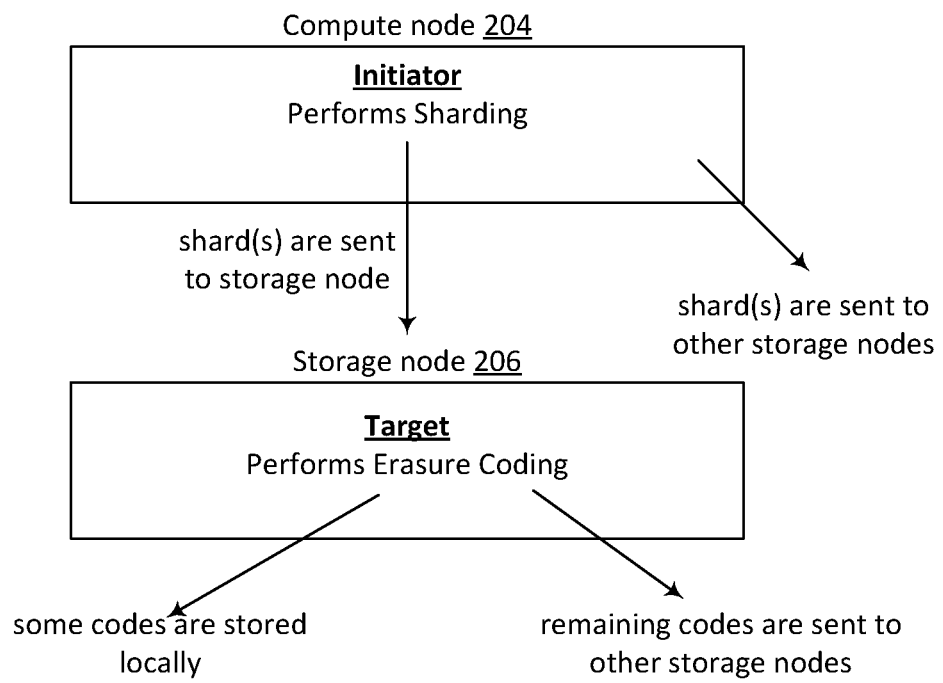
FIG. 2 illustrates an example of a software view of sharding and erasure coding.

FIG. 2 illustrates an example of a software view of sharding and erasure coding. FIG. 2 shows a compute node 204. The compute node can be the same as or similar to the compute node 104 of FIG. 1. The compute node 204 in the illustrated example is an "initiator" or "master node" that performs sharding and sends the shards to other nodes for subsequent erasure coding and storage. Sharding involves dividing a volume of data into multiple shards. Continuing the example from above, the initiator divides a 10 GB volume of data into 1000 10 MB shards. After sharding, the initiator sends the shards to multiple other nodes (targets), including the storage node 206.

A target storage node 206 receives one or more shards from the initiator compute node 204. The storage node 206 can be the same or similar to the storage node 106 of FIG. 1. After receiving the shards from the initiator node, the target node performs erasure coding. To perform erasure coding, the target node divides each shard into logical-spans that are erasure coded and stored across multiple nodes and disks. The erasure coding adds redundancy that enables recovery of the data in the event of errors. Referring to the example above where a shard is 10 MB, the storage node 206 divides each 10 MB shard into 100 100 kB logical-spans, which are then erasure coded to 140 100 kB codes. One or more of the codes are typically stored locally on the target node, and the target node sends the remaining codes to other nodes for storage. In the example above in which a shard is erasure coded to 140 codes, a portion of those code (e.g., 10) can be stored on the storage node 206, while the remaining 130 codes are sent to other storage nodes.

In one example where data is sharded, erasure coded, and stored across multiple disks and racks, the locations of shards and codes are tracked using maps. For example, referring to FIG. 2, the compute node 204 can maintain a "shard map" or "volume map" that specifies for any given data-volume, the constituent shard-locations. The owner storage nodes can store a map indicating the location of codes for the given shards it maintains (an "EC map"). The maps are typically replicated among the nodes to ensure fault-protection. FIGS. 3A and 3B illustrate exemplary shard and EC maps, respectively. Although the maps are illustrated as tables, any suitable data structures that enable indexing or searching may be used to store the mapping data (e.g., linked lists, hash tables, arrays, or other suitable data structures). In the exemplary shard map 300A of FIG. 3A, the shard number is the index into a table that stores the owner sled and rack number for a given shard. Similarly, in the exemplary EC map 300B of FIG. 3B, the code number is the index into the table that stores the physical addresses of the codes comprising the shard. The physical addresses indicate the sled number, disk number on the sled, and sector-range on that disk (e.g., logic block address (LBA) where the code is stored). FIGS. 3A and 3B illustrate one example of how shards and codes can be mapped, however, any other suitable technique for tracking mappings may be used. For example, mappings may determined algorithmically rather than storing mapping data in data structures.

Figure 4:
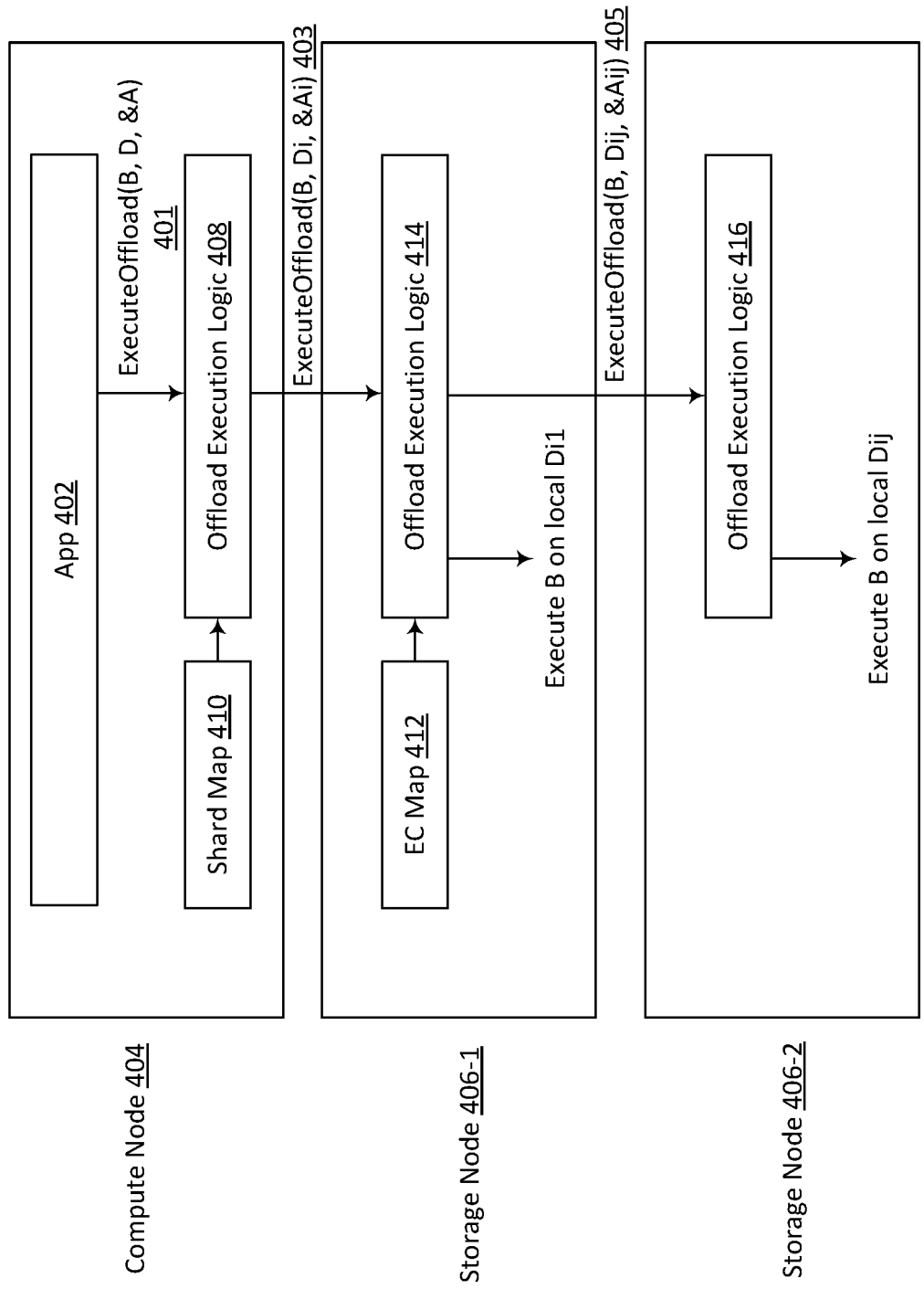
FIG. 4 illustrates a high-level block diagram of a technique of running storage offloads on data that is sharded and erasure-coded.

FIG. 4 illustrates a high-level block diagram of a technique of running storage offloads on data that is sharded and erasure-coded across multiple storage nodes and racks. FIG. 4 illustrates a compute node 404 and two storage nodes 406-1 and 406-2. The compute node can be the same as or similar to the compute node 104 of FIG. 1. The storage nodes 406-1 and 406-2 can be the same as or similar to the storage nodes 106 of FIG. 1. As explained above, in one example, the nodes are sleds for use in one or more racks in a data center.

As illustrated in FIG. 4, an application (App) is running on compute node 404. The application can be, for example, a virtual machine (VM) running on the compute node. The application running on compute node 404 needs to access data that is sharded and erasure-coded and stored on other nodes. In a conventional system, the data would be requested from all the nodes storing the data, and the nodes storing the data would send the data to the requesting node. The requesting node could then perform the operation on the data and write any changes to the data to the other storing nodes. Therefore, a significant amount of data is transferred amongst nodes in conventional systems.

In contrast, the technique illustrated in FIG. 4 enables offloading the operation to the nodes where the data is stored, which can significantly reduce data transfer amongst nodes. In the example illustrated in FIG. 4, the application running on the compute node executes an offload request or command 401: status←ExecuteOffload (offload-logic-binary B, data-range D, answer data range*A). The command 401 is expected to run operation B on the data located at addresses D, and expects to store the answer or result of the operation in location A. Other offload commands may pass more, less, or different information to the receiving node. For example, an offload command may cause nodes to send results back to the requesting node rather than storing the results at a specified location.

Referring again to FIG. 4, the command 401 is passed to the compute node's offload execution logic 408. The logic 408 includes sharding logic that uses a shard map 410 to map data D into constituent shards S1, . . . , Sa. For each shard Si, the compute node sends the command 403 to the owner storage node of the shard Si. Referring to FIG. 1, the I/O interface logic 115 of the compute node 104 sends the offload command to the owner storage node, and the owner storage node receives the command via its I/O interface logic 125. Referring to command 403 (status←(Owner storage node for Si). ExecuteOffload (B, Di=D∩Si, &Ai)), Di is the part of the target range of data that belongs to shard Si. Ai can be, for example, a temporary buffer location where the result from command 403 can be stored. The command is received by the storage node 406-1. The storage node 406-1 passes the command 403 to its offload execution logic 414 for processing. The logic 414 processes the command by mapping Di to its target disks X1, . . . , Xb using the EC map 412. The storage node 406-1 then issues the offload command 405 to the corresponding storage nodes for each disk Xj: status←(storage node for Xj). ExecutePostEcOffload (B, Dij=portion of Di on Xj, &Aij). Aij may be temporary buffers where the result of the command 405 is stored. In the illustrated example, the storage node 406-2 is one of the storage nodes to receive the command 405. However, more than one storage node may include a storage device that stores an EC code, and therefore more than one storage node may receive the command 405.

The storage node 406-2 passes the command 405 to its offload execution logic 416, which then reads the data at addresses Dij, performs the operation B on the data, and places the result in Aij. For example, referring to FIG. 1, a storage node 106 reads the data (codes) stored on one or more of the SSDs 116 and the processing circuitry 120 performs the operation on the data. Upon completing, the command 405 being executed on storage node 406-2 returns a status indicator to the logic 414 of the owner storage node 406-1. Once the logic 414 receives all status indicators from the storage nodes to which the command 405 was sent to, the command 403 being executed on storage node 406-1 returns a status indicator to the logic 408 of the compute node. After all the results are available from the storage nodes, the compute node can then process or collect the results (which in some examples involves combining or concatenating the results). The command 401 being run on the compute node 404 then returns a status indicator to the calling application 402.

In one example, the status indicators indicate whether the command succeeded or failed. The status indicator can also include a failure code that indicates the type of failure that occurred. For example, in the case of a data error (e.g., if a node 406-2 fails to read the code at the address Dij), then the command 405 can return a failure status and indicate that the node failed to read a code. The owner node (node e.g., 406-1) then uses EC logic to recover the data. Once the data is recovered by the node 406-1, the node 406-1 (e.g., processing circuitry on the node 406-1) can process B on the recovered data locally before providing the result to the compute node 404.

In another example, the status indicators can indicate the existence of data dependency. When data dependency exists, the offloads are "stateful". In contrast, for "stateless" offloads, each sub-range of data can be operated on independently and the answers can be collected (e.g., concatenated) by the next-level up storage or compute node to form the final answer A. Stateful offloads have data dependencies between its data-portions (E.g., amongst shards and/or codes). In one example in which data dependencies exist, the offload-execution commands return a status code indicating that it doesn't have enough data on a given controller to do the required processing. The next-level up controller can then read the data (not the answers) on which B must operate, and then execute B. This process can happen recursively, with the worst case being that the compute node runs the offload. In another example, the operation B specifies how data sections that span multiple devices (e.g., data dependencies) will be handled.

Figure 5B:
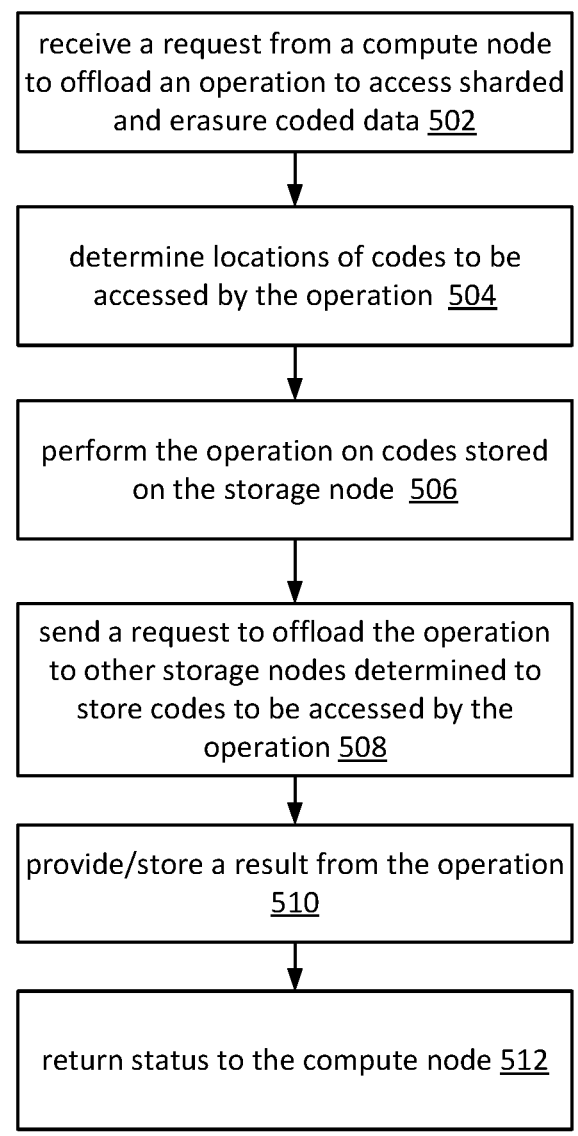

FIGS. 5A and 5B are flow charts of methods of offloading operations on data that is sharded and erasure-coded across multiple nodes and racks. The method 500A of FIG. 5A illustrates a method performed at a compute node. The method 500B of FIG. 5B illustrates a method performed at a storage node. For example, referring to FIG. 1, the method 500B of FIG. 5B can be performed at a storage node 106 and the method 500A of FIG. 5A can be performed at a compute node 104. In the examples illustrated in FIGS. 5A and 5B, the initiating node is the compute node and the node storing the data and performing the compute offload is the storage node. However, in other examples, the nodes have the same or similar resources and are simply nodes, sleds, or server computers rather than "compute nodes" and "storage nodes."

Referring now to FIG. 5A, a compute node determines that an operation is to be performed on data that is stored across multiple nodes, at operation 531. For example, referring to FIG. 4, the compute node 404 is running an application 402 that is to access data. The application can be, for example, a virtual machine, an application running on a virtual machine, or other application. To run the application, an operation is to be performed on data that is stored across multiple nodes. For example, the data can be sharded and/or erasure coded and stored on multiple storage nodes. Referring to FIG. 4, the data can be stored on storage nodes 401-1 and 406-2. Instead of retrieving the data from all the nodes on which the data is stored (which would involve transferring all the data to the compute node), the compute node attempts to offload the operation to the storage nodes where the data is stored. The compute node determines the locations of the shards to be accessed by the operation, at operation 532. For example, referring to FIG. 4, the application 402 running on the compute node 404 sends the request to offload execution logic 408. The logic 408 to determine the location of shards can be software executed on a processing device, hardware, or a combination of hardware and software. The logic 408 determines the locations of shards to be accessed based on a shard map 410 or based on an algorithm.

After determining the locations of the shards, the compute node sends a request to offload the operation to each of the nodes determined to store a shard, at operation 534. For example, referring to FIG. 4, the offload execution logic 408 sends the request 403 to the storage node 406-1 and any other nodes storing the data. The nodes receiving the offload request will then attempt to further offload the request to nodes storing codes. Once the nodes storing the data either complete the operation or determine that the operation cannot be completed, the nodes return a status indicator to the node from which they received the request. For example, referring to FIG. 4, the storage node 406-2 returns a status indicator to the storage node 406-1, and the storage node 406-1 returns a status indicator to the compute node 404. In one example, if one of the nodes was unable to complete the operation, the node returns an error code indicating the type of error encountered. In some error cases, the next-level up node can perform an operation that failed. For example, the storage node 406-1 may be able to perform an operation that failed on the storage node 406-2 (e.g., by recovering data or retrieving data from multiple nodes in the case of data dependencies). Similarly, the compute node 404 may be able to perform an operation that failed on the storage node 406-1. Thus, in the worst case, the compute node performs the operation on the data, but in most cases, the operation can be offloaded to one or more nodes where the data is stored. After the operation is complete on all the nodes the request was sent to, the compute node combines the results, at operation 536. Combining the results can involve, for example, concatenating the results, adding the results, averaging the results, or performing some other operation on the resulting data. In other examples, the results are not combined, but one or more of the results is individually used by the compute node.

FIG. 5B illustrates an offloading technique from the perspective of a storage node. The method 500B of FIG. 5B starts when a compute node sends a request to the storage node to offload an operation (e.g., operation 534 of FIG. 5A) and the compute node receives the request, at operation 502. The storage node then determines the locations of codes to be accessed by the operation, at operation 504. For example, referring to FIG. 4, the offload execution logic 414 of the storage node 406-1 receives the offload request from the compute node 404. The logic 414 then determines the locations of the codes in a shard to be accessed by the operation. The logic 414 determines locations of the codes based on an EC map 412 or algorithmically. For any codes that are stored locally on that storage node, processing circuitry at the storage node performs the operation on the codes, at operation 506. For any codes stored on other nodes, the storage node sends the request to offload the operation to those other nodes, at operation 508. For example, referring to FIG. 4, the storage node 406-1 sends the offload request 405 to the storage node 406-2, which was determined to store at least one code to be accessed by the operation. After performing the operation, the storage node provides the result from the operation, at operation 510. For example, the storage node can store the result at a specified location or send the result to the compute node.

Once the operation is complete (or if the operation failed), the storage node returns a status indicator to the compute node, at operation 512. In one example, if an error is encountered, the node encountering the error provides an error code to the next level-up node indicating the type of error. Depending on the error code, the next-level up node may be able to complete the failed operation. For example, if the storage node 406-2 is unable to read the requested code, the storage node 406-2 sends an error code to the storage node 406-1 indicating that a failure occurred due to the unreadable code. The storage node 406-1 can then recover the code using redundant erasure-coded data. After the storage node 406-1 recovers the code, the storage node 406-1 can perform the operation and return provide the result to the compute node 404. As mentioned above, an operation can also fail due to data dependency (e.g., amongst multiple codes stored on multiple nodes). In one such example, the storage node 406-2 receives the request to offload the operation but determines that some of the data to be operated on is stored on another node. The storage node 406-2 then returns an error code indicating failure due to data dependency to the storage node 406-1 and also provides the data (e.g., the code(s)) to the storage node 406-1. Storage node 406-1 then determines which other node(s) store the data needed to perform the operation and requests the data from those nodes. After receiving data from all the other nodes, the storage node 406-1 can perform the operation on the data for which there are dependencies. Similarly, the storage node 406-1 may be unable to perform the operation due to data dependency (e.g., amongst multiple shards). In one such example, the compute node 404 receives the data for which there are dependencies and performs the operation at the compute node.

FIG. 6A is an example of psuedocode for offloading an operation that is sharded and stored across multiple nodes. The psuedocode of FIG. 6A is for a ComputeSled::ExecuteOffload function that can be performed, for example, by a compute node such as the compute node 404 of FIG. 4. The ComputeSled::ExecuteOffload function of FIG. 6A can be, for example, the same or similar to the command 401 of FIG. 4. The ComputeSled::ExecuteOffload function receives an offload-binary B (the operation to offload), and a data-range D. In another example, the offload-binary is not passed to the function; instead, information indicating the type of operation to be performed is passed to the function. The function returns a status and an answer.

The pseudocode of the ComputeSled::ExecuteOffload function of FIG. 6A starts at line 600 with identifying shards $S_i$-$S_a$ that together contain data D. For each of the shards $S_i$-$S_a$, the owner storage sled is identified at lines 602-604. The owner storage sled is the sled that received the shard, erasure-coded the shard, and stored the codes and/or sent the codes to other nodes for storage. Therefore, the owner sled typically stores at least part of the shard (e.g., one or more codes of the erasure-coded shard), but may not store all the codes. However, in other examples, the owner sled stores none of the codes, or all of the codes (e.g., across multiple storage devices of the owner sled).

Referring again to FIG. 6A, for each shard, the addresses of the shard are determined at line 606. For example, the addresses of the shard data that is associated with a given owner sled are determined. An offload command is then sent to the owner sled at line 608. The offload command indicates the addresses of the data range for the given shard as well as the command B. The command returns a status and an answer. The status includes, for example, whether the operation completed successfully. The command can also return an error code (e.g., as part of the status indicator, or as a separate indicator). In another example, the error code, status, and/or answer are stored on a storage device rather than returned from the command.

At lines 610-616, if the status indicates that the operation failed due to insufficient data, the compute node reads all the data D and executes the operation B on D at the compute node. At lines 618-622, if the status indicates another failure code, then the ComputeSled::ExecuteOffload command returns a status indicating the attempt to offload the operation failed. If the operation was successfully offloaded, the compute node appends the answers provided by the storage nodes together at line 626. The ComputeSled::ExecuteOffload function then returns a status indicating the offload was successful and returns the answer at line 628.

Although the examples in the present disclosure refer to codes and shards, the offloading techniques described herein apply to other ways of dividing data into chunks or portions, with or without coding and redundancy, where the chunks of data are stored on at least one node other than the initiating node. Additionally, although the examples illustrate two "levels" of dividing data (into shards, which are then erasure coded and stored as codes), the same offloading techniques apply to data that is divided at one or more levels.

FIG. 6B is an example of psuedocode for an ExecuteOffload function that can be performed, for example, by a storage node such as the storage node 406-1 of FIG. 4. The StorageSled::ExecuteOffload function of FIG. 6B can be, for example, the same or similar to the command 403 of FIG. 4. The StorageSled::ExecuteOffload function receives an offload-binary B (the operation to offload), and a data-range Di. The data-range Di is the addresses of the portion of the Data D that is included in the shard i. The function returns a status and an answer.

The StorageSled::ExecuteOffload function in FIG. 6B begins by determining which disks store the data Di in the shard i, at line 640. Assuming that the shards were erasure-coded to generate codes that were then stored on multiple storage devices, the function determines which storage devices or disks X1 . . . Xn store the codes. At lines 642-644, for each disk j, the function determines which sled Sj includes the disk j. The addresses Dij of the data for the code(s) on disk j are then determined at line 646. After the disk Xj, Sled Sj, and addresses Dij for the code(s) are determined, the storage sled sends the command to the other storage sled Sj where the codes at Dij are stored at line 648. The ExecutePostEcOffload command of line 646 provides the operation B, the disk Xj, and the addresses of the data Dij stored on disk Xj. The Execute PostEcOffload command returns a status and an answer. The status includes, for example, whether the operation completed successfully. The command can also return an error code (e.g., as part of the status indicator, or as a separate indicator). Similar to the example of FIG. 6A, the error code, status, and/or answer may be stored on a storage device rather than returned from the command. If the status indicates there was insufficient data (e.g., due to a data dependency), the storage sled reads the data at Di at line 652. The function then performs the operation B on the data at Di and returns to the calling compute node, at lines 652-654. If the status indicates that there is a read-failure, the storage node attempts to recover the code (Dataij), at lines 656-660. The storage sled can then perform the operation B on Dataij, at line 662. If the operation fails, the StorageSled::ExecuteOffload function returns a failure status. If the operation completed successfully, then the answers are combined by appending the answers received from the storage sleds with the target disks, at line 674. The function StorageSled::ExecuteOffload then returns a successful status code and the answer for the shard i.

FIG. 6C is an example of psuedocode for an ExecutePostEcOffload function that can be performed, for example, by a storage node such as the storage node 406-2 of FIG. 4. The StorageSled::ExecutePostEcOffload function of FIG. 6C can be, for example, the same or similar to the command 405 of FIG. 4. The StorageSled::ExecutePostEcOffload function receives an offload-binary B (the operation to offload), a disk identifier Xj, and a data-range Dij. The data-range Dij is an address range of the portion of the Data D that is included in the code(s) stored on disk Xj, where the code(s) are a portion of shard Si. The function returns a status and an answer.

The ExecutePostEcOffload function begins by reading the data at addresses Dij on disk Xj, at line 670. If the storage node is unable to read the data, the ExecutePostEcOffload function returns a status indicating a read failure, at lines 672-676. If the read was successful, the storage sled performs the operation B on Dataij and returns a status indicator and/or the result of the operation, at line 678.

Thus, nodes in the system identify where sharding and erasure-coding happen in a system and identify mapping information that can be passed down to the storage devices to enable local compute. The techniques can enable compute-split (the computation is performed on individual codes instead of transferring the data to the compute node), and also enables handling dependencies on data that spans multiple storage devices.

Figure 7:
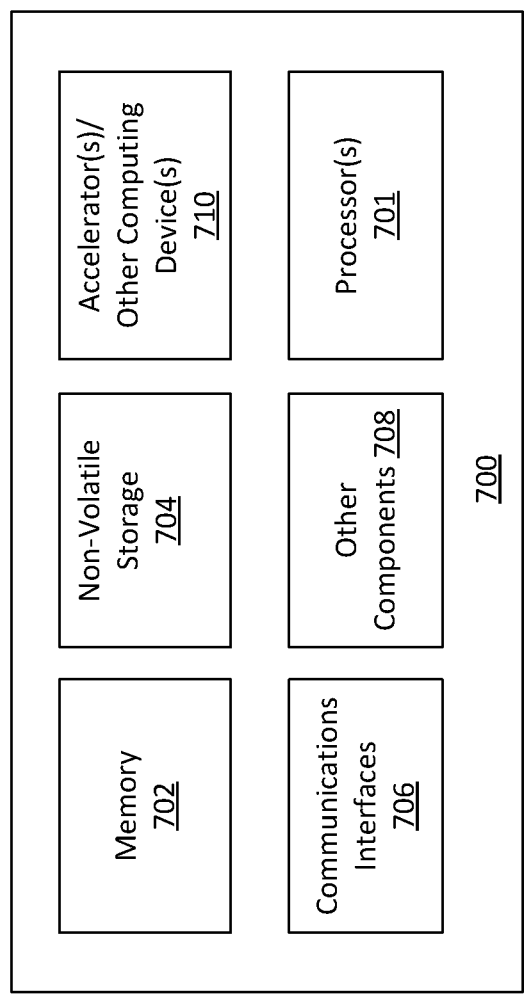
FIG. 7 provides an exemplary depiction of a computing system in which offloading techniques can be implemented.

FIG. 7 provides an exemplary depiction of a computing system 1500 in which offloading techniques can be implemented. The computing system 1500 can be, for example, user equipment, a computer, a personal computer (PC), a desktop computer, a laptop computer, a notebook computer, a netbook computer, a tablet, a smart phone, embedded electronics, a gaming console, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. As observed in FIG. 7, the system 700 includes one or more processors or processing units 701 (e.g., host processor(s)). The processor(s) 701 may include one or more central processing units (CPUs), each of which may include, e.g., a plurality of general purpose processing cores. The processor(s) 701 may also or alternatively include one or more graphics processing units (GPUs) or other processing units. The processor(s) 701 may include memory management logic (e.g., a memory controller) and I/O control logic. The processor(s) 701 typically include cache on a same package or near the processor.

The system 700 also includes memory 702 (e.g., system memory). The system memory can be in the same package (e.g., same SoC) or separate from the processor(s) 701. The system 700 can include static random access memory (SRAM), dynamic random access memory (DRAM), or both. In some examples, memory 702 may include volatile types of memory including, but not limited to, RAM, D-RAM, DDR SDRAM, SRAM, T-RAM or Z-RAM. One example of volatile memory includes DRAM, or some variant such as SDRAM. Memory as described herein may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications. In one example, the memory 702 includes a byte addressable DRAM or a byte addressable non-volatile memory such as a byte-addressable write-in-place three dimensional crosspoint memory device, or other byte addressable write-in-place non-volatile memory devices (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

The system 700 also includes communications interfaces 706 and other components 708. The other components may include, for example, a display (e.g., touchscreen, flat-panel), a power supply (e.g., a battery or/or other power supply), sensors, power management logic, or other components. The communications interfaces 706 may include logic and/or features to support a communication interface. For these examples, communications interface 706 may include one or more input/output (I/O) interfaces that operate according to various communication protocols or standards to communicate over direct or network communication links or channels. Direct communications may occur via use of communication protocols or standards described in one or more industry standards (including progenies and variants). For example, I/O interfaces can be arranged as a Serial Advanced Technology Attachment (SATA) interface to couple elements of a node to a storage device. In another example, I/O interfaces can be arranged as a Serial Attached Small Computer System Interface (SCSI) (or simply SAS), Peripheral Component Interconnect Express (PCIe), or Non-Volatile Memory Express (NVMe) interface a storage device with other elements of a node (e.g., a controller, or other element of a node). Such communication protocols may be utilized to communicate through I/O interfaces as described in industry standards or specifications (including progenies or variants) such as the Peripheral Component Interconnect (PCI) Express Base Specification, revision 3.1, published in November 2014 ("PCI Express specification" or "PCIe specification") or later revisions, and/or the Non-Volatile Memory Express (NVMe) Specification, revision 1.2, also published in November 2014 ("NVMe specification") or later revisions. Network communications may occur via use of communication protocols or standards such those described in one or more Ethernet standards promulgated by IEEE. For example, one such Ethernet standard may include IEEE 802.3. Network communication may also occur according to one or more OpenFlow specifications such as the OpenFlow Switch Specification. Other examples of communications interfaces include, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system 700 also includes non-volatile storage 704, which may be the mass storage component of the system. Non-volatile types of memory may include byte or block addressable non-volatile memory such as, but not limited to, NAND flash memory (e.g., multi-threshold level NAND), NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), 3-dimensional (3D) cross-point memory structure that includes chalcogenide phase change material (e.g., chalcogenide glass) hereinafter referred to as "3D cross-point memory", or a combination of any of the above. For these examples, storage 704 may be arranged or configured as a solid-state drive (SSD). The data may be read and written in blocks and a mapping or location information for the blocks may be kept in memory 702. The storage or memory of the system 700 can include processing circuitry, enabling some operations described above to be performed in compute-in-memory.

The computing system 700 may also include one or more accelerators or other computing devices 710. For example, the computing system 700 may include an Artificial Intelligence (AI) or machine learning accelerator optimized for performing operations for machine learning algorithms, a graphics accelerator (e.g., GPU), or other type of accelerator. An accelerator can include processing circuitry (analog, digital, or both) and may also include memory within the same package as the accelerator 710.

Examples of techniques to enable offloading operations when data is sharded, erasure-coded, and distributed follow.

In one example, a storage node includes input/output (I/O) interface logic to receive a request from a compute node to offload an operation, the operation to access sharded and erasure-coded data, and send a second request to a second storage node to offload the operation. The storage node also includes processing circuitry to perform the operation on the code and provide a result of the operation. In one example, the storage node further includes a storage device to store one or more codes of the sharded and erasure-coded data.

In one example, the processing circuitry to provide the result is to cause the result to be stored on a storage device. In one such example, the processing circuitry is to cause the result to be stored on the storage device at a location specified by the request from the compute node to offload the operation. In one example, the processing circuitry is to determine locations of codes and offload the operation to storage nodes determined to store the codes. In one such example, the processing circuitry is determine locations of the codes based on a map, wherein the map includes a data structure to indicate physical addresses of the codes. In one example, the processing circuitry is to compute the physical addresses of the codes based on an algorithm.

In one example, the I/O interface logic is to send a status indicator to the compute node to indicate success or failure of the operation. In one such example, the I/O interface logic is to send a failure code to the compute node to indicate the form of an error that caused the operation to fail. In one example, the I/O interface logic is to, in response to failure of the operation due to dependency on a shard not stored on the storage node: return the failure code to indicate data dependency and transmit data to the compute node. In one example, the I/O interface logic is to receive a status indicator from the second storage node to indicate success or failure of the operation on the second storage node. In one example, the I/O interface logic is to receive a failure code from the second storage node to indicate the form of an error that caused the operation to fail.

In one example, the processing circuitry is to, in response to failure of the operation on the second storage node due to a data error, recover the second code, perform the operation on the second code, and provide a second result from the operation to the compute node. In one example, the I/O interface logic is to receive the failure code from the second storage node to indicate the operation failed due to dependency on another code not stored on the second storage node, and receive the second code from the second storage node, and the processing circuitry is to perform the operation on the second code and the other code, and provide a result of the operation on the second code and on the other code to the compute node.

In one example, a system includes a compute node including one or more processors, and a storage node to couple with the compute node. The storage node includes a storage device to store a code of sharded and erasure-coded data, input/output (I/O) interface logic to receive a request from the compute node to offload an operation, the operation to access the sharded and erasure-coded data, and send a second request to a second storage node to offload the operation, and processing circuitry to perform the operation on the code and provide a result of the operation. In one example, the one or more processors of the compute node are to determine locations of shards to be accessed by the operation, the locations to indicate one or more storage nodes determined to store the shards, and send a request to offload the operation to the one or more storage nodes. In one example, the one or more processors of the compute node to determine the locations of shards are to determine physical addresses of the shards based on a map, wherein the map includes a data structure to indicate a rack and storage node for each of the shards. In one example, the one or more processors of the compute node to determine the locations of shards are to determine physical addresses of the shards based on an algorithm. In one example, the processing circuitry of the storage node is to determine locations of codes to be accessed by the operation, and the I/O interface logic of the storage node is to send a request to offload the operation to storage nodes determined to store the codes.

In one example, an article of manufacture including a computer readable storage medium has content stored thereon which when accessed causes one or more processors to execute operations to perform a method involving: receiving, at a storage node, a request from a compute node to offload an operation to access sharded and erasure coded data, the storage node storing a code of the sharded and erasure coded data, performing the operation on the code stored on the storage node, sending a second request to a second storage node to offload the operation, the second storage node storing a second code of the sharded and erasure coded data, and providing a result from the operation to the compute node.

In one example, an article of manufacture including a computer readable storage medium has content stored thereon which when accessed causes one or more processors to execute operations to perform a method involving: sending a request to multiple storage nodes to offload an operation, each of the multiple storage nodes storing at least one code of sharded and erasure-coded data to be accessed by the operation, each of the multiple storage nodes to send a second request to one or more second storage nodes to offload the operation, each of the one or more second storage nodes storing other codes of sharded and erasure-coded data, and combining results from the multiple storage nodes.

In one example, a compute sled includes multiple processors, an I/O interface to: send a request to offload an operation to multiple storage sleds, the multiple storage sleds including storage devices to store codes of shards to be accessed by the operation, the multiple storage sleds to offload the operation to second storage sleds including second storage devices to store other codes of the shards to be accessed by the operation, and logic to access results of the operation from the multiple storage sleds.

Thus, techniques described herein can enable offloading operations when data is sharded, erasure-coded, and stored across multiple nodes.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

Flow diagrams as illustrated herein provide examples of sequences of various process actions. The flow diagrams can indicate operations to be executed by a software or firmware routine, as well as physical operations. In one example, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various examples; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine-readable storage medium can cause a machine to perform the functions or operations described and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Terms used above to describe the orientation and position of features such as 'top', 'bottom', 'over', 'under', and other such terms describing position are intended to clarify the relative location of features relative to other features, and do not describe a fixed or absolute position. For example, a wafer that is described as the top wafer that is above or over a bottom wafer could be described as a bottom wafer that is under or below a top wafer. Therefore, the illustrations and examples herein should be construed in an illustrative, and not a restrictive sense. The scope of the invention should be measured solely by reference to the claims that follow.

What is claimed is:

1. A storage node comprising:
   input/output (I/O) interface logic to:
      receive a request from a compute node to offload an operation, the operation to access sharded and erasure-coded data, and
      send a second request to a second storage node to offload the operation; and
   processing circuitry to:
      perform the operation on a code of the sharded and erasure-coded data and provide a result of the operation, and
      in response to failure of the operation on a second code of the sharded and erasure-coded data by the second storage node, recover the second code, perform the operation on the second code, and provide a second result from the operation to the compute node.

2. The storage node of claim 1, further comprising:
   a storage device to store one or more codes of the sharded and erasure-coded data.

3. The storage node of claim 1, wherein the processing circuitry to provide the result is to:
   cause the result to be stored on a storage device.

4. The storage node of claim 3, wherein the processing circuitry to cause the result to be stored is to:
   cause the result to be stored on the storage device at a location specified by the request from the compute node to offload the operation.

5. The storage node of claim 1, wherein the processing circuitry is to:
   determine locations of codes of the sharded and erasure-coded data and offload the operation to storage nodes determined to store the codes.

6. The storage node of claim 5, wherein the processing circuitry to determine the locations of the codes is to:
   determine locations of the codes based on a map, wherein the map includes a data structure to indicate physical addresses of the codes.

7. The storage node of claim 5, wherein the processing circuitry to determine the locations of the codes is to:
   compute physical addresses of the codes based on an algorithm.

8. The storage node of claim 1, wherein the I/O interface logic is to:
   send a status indicator to the compute node to indicate success or failure of the operation.

9. The storage node of claim 8, wherein the I/O interface logic is to:
   send a failure code to the compute node to indicate the form of an error that caused the operation to fail.

10. The storage node of claim 9, wherein the I/O interface logic is to:
    in response to failure of the operation due to dependency on a shard not stored on the storage node: return the failure code to indicate data dependency and transmit data to the compute node.

11. The storage node of claim 1, wherein the I/O interface logic is to:
    receive a status indicator from the second storage node to indicate success or failure of the operation on the second storage node.

12. The storage node of claim 1, wherein the I/O interface logic is to:
    receive a failure code from the second storage node to indicate the form of an error that caused the operation to fail.

13. The storage node of claim 1, wherein:
    the I/O interface logic is to:
       receive a failure code from the second storage node to indicate the operation failed due to dependency on another code not stored on the second storage node, and
       receive the second code from the second storage node; and
    the processing circuitry is to:
       perform the operation on the second code and the other code, and
       provide a result of the operation on the second code and on the other code to the compute node.

14. A system comprising:
a compute node including one or more processors; and
a storage node to couple with the compute node, the storage node including:
  a storage device to store a code of sharded and erasure-coded data;
  input/output (I/O) interface logic to:
    receive a request from the compute node to offload an operation, the operation to access the sharded and erasure-coded data, and
    send a second request to a second storage node to offload the operation; and
  processing circuitry to:
    perform the operation on a code of the sharded and erasure-coded data and provide a result of the operation, and
    in response to failure of the operation on a second code of the sharded and erasure-coded data by the second storage node, recover the second code, perform the operation on the second code, and provide a second result from the operation to the compute node.

15. The system of claim 14, wherein the one or more processors of the compute node are to:
  determine locations of shards to be accessed by the operation, the locations of shards to indicate one or more storage nodes determined to store the shards; and
  send a request to offload the operation to the one or more storage nodes.

16. The system of claim 15, wherein the one or more processors of the compute node to determine the locations of shards are to:
  determine physical addresses of the shards based on a map, wherein the map includes a data structure to indicate a rack and storage node for each of the shards.

17. The system of claim 15, wherein the one or more processors of the compute node to determine the locations of shards are to:
  determine physical addresses of the shards based on an algorithm.

18. The system of claim 14, wherein:
  the processing circuitry of the storage node is to determine locations of codes to be accessed by the operation; and
  the I/O interface logic of the storage node is to send a request to offload the operation to storage nodes determined to store the codes.

19. An article of manufacture comprising a computer readable storage medium having content stored thereon which when accessed causes one or more processors to execute operations to perform a method comprising:
  receiving, at a storage node, a request from a compute node to offload an operation to access sharded and erasure coded data, the storage node storing a code of the sharded and erasure coded data;
  performing the operation on a code of the sharded and erasure-coded data stored on the storage node;
  sending a second request to a second storage node to offload the operation, the second storage node storing a second code of the sharded and erasure coded data;
  providing a result from the operation to the compute node; and
  in response to failure of the operation on a second code of the sharded and erasure-coded data by the second storage node, recover the second code, perform the operation on the second code, and provide a second result from the operation to the compute node.

20. The article of manufacture of claim 19, wherein providing the result comprises:
  storing the result on a storage device.

* * * * *